United States Patent
Deurenberg et al.

(10) Patent No.: US 8,594,174 B2
(45) Date of Patent: Nov. 26, 2013

(54) ROTATING PULSE-WIDTH MODULATOR

(75) Inventors: Peter Hubertus Franciscus Deurenberg, S-Hertogenbosch (NL); Joannes Wilhemus Gertrudis Marie Jacobs, Roermond (NL)

(73) Assignee: NXP B.V., Eindhoven (NL)

( * ) Notice: Subject to any disclaimer, the term of this patent is extended or adjusted under 35 U.S.C. 154(b) by 595 days.

(21) Appl. No.: 12/936,999

(22) PCT Filed: Apr. 14, 2009

(86) PCT No.: PCT/IB2009/051556
§ 371 (c)(1),
(2), (4) Date: Oct. 8, 2010

(87) PCT Pub. No.: WO2009/125377
PCT Pub. Date: Oct. 15, 2009

(65) Prior Publication Data
US 2011/0026580 A1    Feb. 3, 2011

(30) Foreign Application Priority Data

Apr. 10, 2008    (EP) .................................... 08103489

(51) Int. Cl.
*H03K 7/08*    (2006.01)
*H03K 9/08*    (2006.01)

(52) U.S. Cl.
USPC ........................ 375/238; 375/253; 375/254

(58) Field of Classification Search
USPC .......... 375/237–239, 242–256, 259–260, 353
See application file for complete search history.

(56) References Cited

U.S. PATENT DOCUMENTS

| 4,095,275 A | 6/1978 | Fluet |
| 4,772,833 A | 9/1988 | Tanaka |
| 6,044,113 A | 3/2000 | Oltean |
| 6,385,067 B2 | 5/2002 | Galbiati |
| 6,411,046 B1 | 6/2002 | Muthu |
| 6,545,621 B1 | 4/2003 | Madni et al. |
| 8,350,536 B2 * | 1/2013 | Lueger .......................... 320/164 |

(Continued)

FOREIGN PATENT DOCUMENTS

| CN | 2216190 Y | 12/1995 | |
| EP | 1624569 A1 | 2/2006 | |
| WO | WO2007079907 | * 7/2007 | ................ H02J 7/00 |

OTHER PUBLICATIONS

Deurenberg, Peter, et al; "Achieving Color Point Stability in RGB Multi-Chip LED Modules Using Various Color Control Loops"; Proc. SPIE, vol. 5941; Bellingham, WA, US; 12 pages; (Sep. 7, 2005).

Hoelen, C., et al; "Color Tunable LED Spot Lighting"; Proc. SPIE, vol. 6337; pp. 1-15 (2006).

(Continued)

*Primary Examiner* — Sam K Ahn
*Assistant Examiner* — James M Perez

(57) ABSTRACT

A driver for driving an LED uses PWM in a sequence of the periods. The driver has a modulo counter, that is reset after each period. The driver has a first adder for combining the count value with a quantity indicative of a shift of the LED's control pulse relative to the start of the period; a second adder for combining the count value with a width quantity indicative of a width of the control pulse; and a logic gate receiving the MSBs at the outputs of the adders and supplying the control pulse.

3 Claims, 14 Drawing Sheets

(56) References Cited

U.S. PATENT DOCUMENTS

| | | |
|---|---|---|
| 2005/0285582 A1* | 12/2005 | Azuma et al. .................. 323/282 |
| 2006/0113981 A1 | 6/2006 | Chapuis |
| 2007/0216638 A1 | 9/2007 | Kojima |
| 2008/0007182 A1 | 1/2008 | Deurenberg et al. |
| 2008/0181293 A1* | 7/2008 | Kris .............................. 375/238 |

OTHER PUBLICATIONS

Muthu, S., et al; "Red, Green and Blue LEDs for White Light Illumination"; IEEE Journal on Selected Topics in Quantum Electronics 8(2); pp. 333-338 (2002).

International Search Report and Written Opinion for Application PCT/IB2009/051556.

* cited by examiner

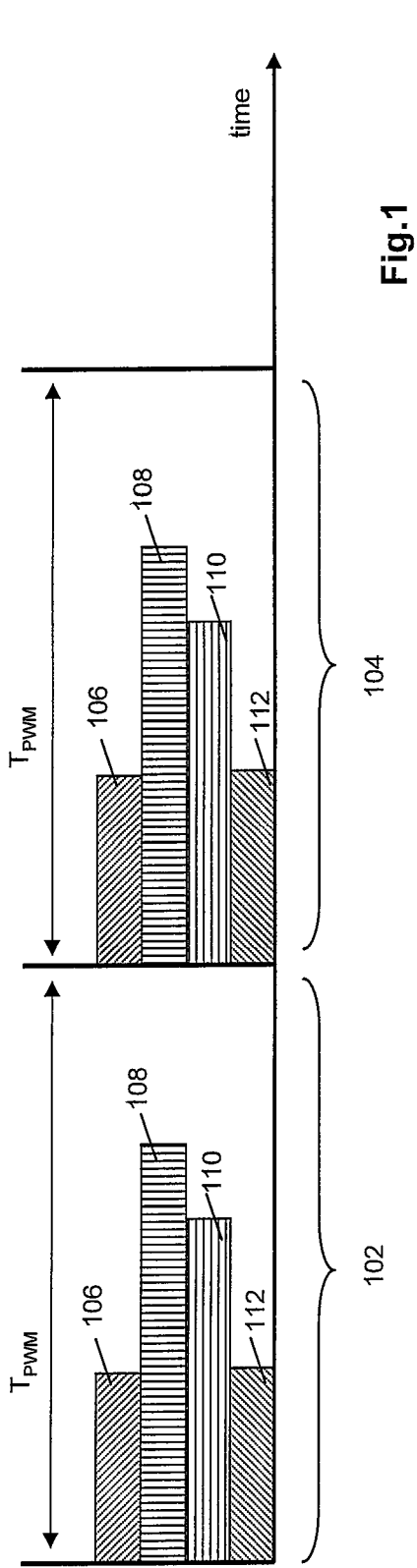
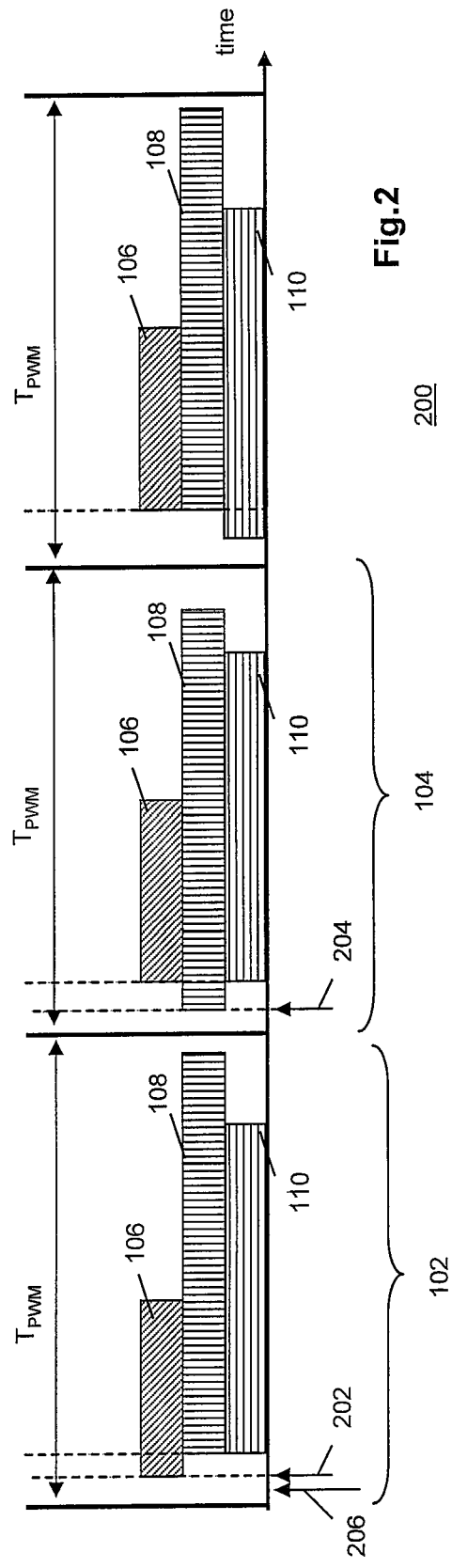

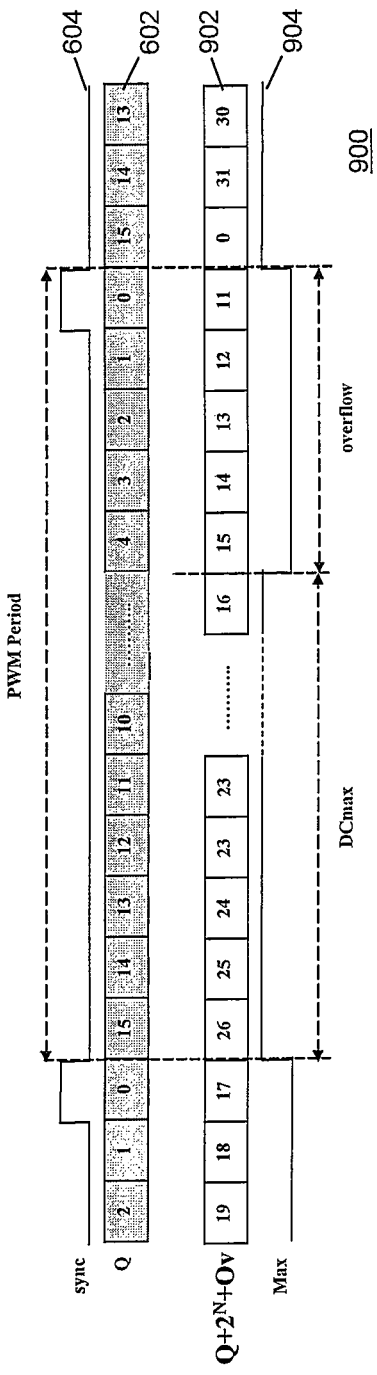

$$L_{Pon} = 2^N - M - B = 14$$

$$P_{Pon} = M + B + L + (P - M) = 12$$

$$L_{Pon} + P_{Pon} = 2^N - M - B + M + B + L + (P - M) = 2^N + L + P - M = 26$$

Fig.18

ROTATING PULSE-WIDTH MODULATOR

FIELD OF THE INVENTION

The invention relates to an electronic device with circuitry for generating a control signal using pulse-width modulation. Such circuitry can be used in particular, but not exclusively, for providing control signals to a LED driver.

BACKGROUND OF THE INVENTION

Pulse-width modulation (PWM) is a known technique used to modulate the duty cycle of a signal or of a power source, or of the operation of a device. The duty cycle is representative of the proportion of time that the signal, power source or device is active. PWM is used to control, e.g., a three-phase motor or another electrical motor, power supply to an amplifier, a light source, a light dimmer, a voltage regulator, etc. By way of example, PWM is being discussed in more detail herein below within the context of driving light-emitting diodes (LEDs).

Multi-color LED light sources typically use PWM for accurately setting the color and the perceived power of light (lumen). Using PWM to drive LEDs offers many advantages compared to straightforward amplitude modulation (AM). LEDs driven with a varying current not only show a change in the amount of light, but also show a change in the color of the light. Moreover, the change in light output is also non-linear: the LED usually has a higher efficiency at lower drive currents. With PWM modulation, the LED color remains much more constant, because the LED is driven with a constant current. The light output can be changed in a linear fashion by changing the on-time of the LED. Accordingly, amplitude modulation provides a non-linear LED response, whereas PWM gives a linear response. Especially when dimming multi-color LED systems (e.g., red-green-blue or: RGB), the non-linearity of AM causes problems, because the balance between the LED colors needs to be adjusted.

In some multi-color LED applications using PWM, all colors are turned-on simultaneously at the start of the PWM period. FIG. 1 is a diagram 100 illustrating this scenario. The horizontal axis is the time axis that is divided into a sequence of operation cycles (also referred to as PWM periods) 102, 104, . . . . Block 106 indicates the time interval wherein a red-color LED is turned on. Block 108 indicates the time interval wherein a green-color LED is tuned on. Block 110 indicates the time interval wherein a blue-color LED is turned on. Block 112 indicates the time interval wherein an amber-color LED is turned on. This scenario results in a very steep load increase on the supply line every time a PWM period starts. Also, the resulting color image may be perceived as flickering, especially for low levels of light that use significantly shorter duty cycles.

As known, the characteristics of an LED, e.g., its color and its luminosity, change with temperature. The color changes as a result of the changing band gap of the LED's semiconductor material. The amount of light emitted decreases with increasing temperature. This is due to an increase in recombination of holes and electrons that do not contribute to the emission of light. Accordingly, a feedback mechanism can be used to control the drive currents of the LEDs in dependence on their measured light output so as to stabilize, e.g., the color. See, e.g., "Achieving color point stability in RGB multi-chip LED modules using various color control loops", P. Deurenberg et al., Proc. SPIE, Vol. 5941, pp 63-74, 2005; US published patent application 2008007182; and U.S. Pat. No. 6,411,046. This approach may require specific distributions of the turn-on periods over the PWM periods. FIG. 2 illustrates this scenario with time intervals 106, 108 and 110 for the red, green and blue colors, respectively, in this example. In this example, the turn-on time for a single one of the colors in an individual one of the PWM periods precedes the turn-on times of the other colors. Time interval 106 starts at a time indicated by an arrow 202 in PWM period 102, time interval 108 starts at a time indicated by an arrow 204 in PWM period 104, etc. In each PWM period, the other two colors start later. This enables the sensor in the feedback mechanism to measure the contribution of the LED, turned-on first, to the light incident on the sensor. An arrow 206 indicates a moment where all LEDs are turned-off, so as to enable the sensor to determine light incident from other sources. Thus, the feedback mechanism eventually identifies the contribution per single LED and controls the LEDs individually to stabilize their performance in operational use.

Still multiple LEDs are turned on simultaneously in above scenarios, giving rise to the problems mentioned above (i.e., peak load and flickering).

A commonly known approach to improve above situation is shift the starting time of each different LED by a different time period relative to the start of each PWM period, so as to distribute the leading edges of each LED color block 106-112 over the PWM period. FIG. 3 illustrates this scenario. For further information see, e.g., "Achieving color point stability in RGB multi-chip LED modules using various color control loops", P. Deurenberg et al., Proc. SPIE, Vol. 5941, pp. 63-74, 2005; "Color tunable LED spot lighting", C. Hoelen et al., Proc. SPIE, Vol. 6337, pp. 1-15, 2006; "Red, green and blue LEDs for white light illumination", S. Muthu et al., IEEE Journal on Selected Topics in Quantum Electronics 8(2), pp. 333-338, 2002.

SUMMARY OF THE INVENTION

However, as a result of distributing the leading edges of each LED color block over the PWM period, the active time interval of one of more LEDs may extend into the next PWM period. This is a problem, because the known PWM generators used in this context are synchronized on the PWM period and therefore do not allow these extensions. In a typical implementation, a counter is reset at the beginning of each PWM period. The counter value is increased every clock cycle until the PWM period terminates and the counter is reset. During the time period, wherein the counter value is smaller than the required duty cycle of the relevant LED, a logic high control signal is produced. A logic low control signal is produced if the counter value is larger than the required duty cycle. The control signal determines whether the LED is turned-on or turned-off. Accordingly, this known implementation does not allow for duty cycles extending across two successive PWM periods.

Control is even getting more complicated in the scenario of extensions into the next PWM interval if allowance is made for individual color measurements as discussed under FIG. 2. This scenario is illustrated in FIG. 4. Herein, successive PWM periods each have a time interval, e.g., interval 402, interval; 404, interval 408 and interval 410, wherein part of the time none of the LEDs is active and the other part of the time only one of the LEDs is active as its starting time is shifted forward. For example, in interval 406, only the blue color LED of block 110 is active for the last portion as its starting time is shifted into the interval 406 wherein color measurements are being made.

It is one of the objects of the invention to provide an electronic device with circuitry for generating a control signal using pulse-width modulation, wherein a duty cycle is allowed to extend into a next period.

Therefore, the inventors propose an electronic device with circuitry for generating a control pulse using pulse-width modulation during each specific one of a plurality of periods in a sequence of the periods. The circuitry comprises a modulo-counter, whose count value is reset to a predetermined value after the specific period has elapsed. The circuitry further comprises signal generation means connected to the counter. The signal generation means comprises: a first combiner for supplying at a first combiner output the count value combined with an edge quantity indicative of a shift of an edge of the control pulse (e.g., the leading edge or the trailing edge) relative to a beginning of the current period; a second combiner for supplying at a second combiner output the count value combined with a width quantity indicative of a width of the control pulse; and a first logic gate receiving first and second bit values, respectively, indicative of a first most-significant bit at the first combiner output and of a second most-significant bit at the second combiner output, and supplying at a first gate output a first logic output signal representative of the control pulse.

Setting the appropriate switching-on and switching-off times in the control pulse corresponds to setting the appropriate values of the edge quantity and the width quantity. This opens up a modular approach for the architecture of driving an entity in PWM mode, e.g., one or more LEDs, an electric motor, a power supply, etc., as discussed further below.

In an embodiment of the invention, the signal generation means further comprises: a third combiner for supplying at a third combiner output the most-significant bit of the count value combined with an overflow quantity indicative of an upper boundary of the width; and a second logic gate connected to the third combiner output and to the first gate output for providing at a second gate output a second logic output signal representative of the control pulse. This embodiment allows setting a maximum pulse width for the control pulse.

In a further embodiment of the invention, the signal generation means further comprises: an inverter connected to the modulo counter for inverting the count value; a fourth combiner for supplying at a fourth combiner output the inverted count value with a second width quantity indicative of a second width of a time interval during the specific period; a third logic gate connected to the second gate output for receipt of the second logic output signal and to the fourth combiner output for receipt of the most-significant bit of the inverted count value combined with the second width quantity, and having a third gate output for supply of a third logic output signal representative of the control pulse. This embodiment specifies an implementation for reserving a particular time window within the specific period. This particular window can be used for, e.g., conducting measurements in case of the control pulse being used to drive a LED in order to implement a feedback mechanism to control the drive currents of the LEDs in dependence on their measured light output so as to stabilize, e.g., the color.

In still a further embodiment of the invention, the signal generation means comprises power control circuitry for generating a power control signal for control of a power supply to a physical entity (e.g., LED, electric motor, etc.) controlled by the control pulse. The power control circuitry comprises: first means for supplying a first intermediate signal, generated by modifying the count value combined with the edge quantity by a lead quantity indicative of a time for switching on the power supply prior to switching on the entity with the control pulse; second means for supplying a second intermediate signal, generated by modifying the count value combined with the width quantity by the lead quantity and for supplying a second power control signal; and third means for generating the power control signal based on subjecting the most-significant bit of the first intermediate signal and the most-significant bit of the second intermediate signal to a logic operation. This embodiment contributes to the power efficiency of the device by timely switching on and switching off the power supply.

In another embodiment of the invention, the device also provides control signals to drivers of, e.g., multiple LEDs, using pulse-width modulation during each specific one of the plurality of periods in the sequence of the periods. More specifically, the circuitry is operative to generate multiple respective further control pulses using pulse-width modulation during each specific one of the plurality of periods in the sequence of the periods. The circuitry comprises multiple further signal generation means connected to the counter. Each respective one of the multiple further signal generation means comprises: a respective first combiner for supplying at a respective further first combiner output the count value combined with a respective further edge quantity indicative of a respective further shift of a respective further edge of the respective further control pulse relative to the beginning of the current period; a respective further second combiner for supplying at a respective further second combiner output the count value combined with a respective further width quantity indicative of a respective further width of the respective further control pulse; and a respective further first logic gate receiving respective first and respective second bit values, respectively, indicative of a respective first most-significant bit at the respective further first combiner output and of a respective second most-significant bit at the respective further second combiner output, and supplying at a respective further first gate output a respective further first logic output signal representative of the respective control pulse.

This embodiment uses a single modulo counter and multiple signal generation means to generate multiple control pulses for supply to, e.g., the drivers of multiple LEDs. Individual ones of the multiple signal generation means receive individual control quantities (e.g., edge quantity and width quantity) to individually set the timing and length of the individual control pulses.

As addressed above, the edge and width quantities can be chosen in such as way as to implement a desired turning-on and turning-off of the controlled entity, e.g., an LED. If the electronic device in the invention is to control one or more further entities (e.g., LEDs), each thereof being controlled independently of one another and of the entity first-mentioned, the same modulo-counter can be used together with one or more further signal generation means, similar to the one discussed above and receiving respective further edge quantities and respective further width quantities. Accordingly, the control of the LEDs discussed under FIG. 4 above boils down to choosing the appropriate edge and width quantities (and other quantities) so as have a modular, programmable design wherein the temporal relationship between the duty cycles of the LEDs is accurately fixed, owing to the use of a single modulo counter. Using a single modulo counter is practical so long as the LEDs are being driven from a single circuit, e.g., a single integrated circuit (IC). If different modulo counters are accommodated at different ICs (e.g., a first IC and a second IC), and if a fixed relationship is to be established between the pulses generated at the different ICs, one could proceed as follows. The modulo counter at the first IC (master device) is driven by a clock generator, and the modulo counter at the second IC (slave device) is driven by a phase-locked loop (PLL). The modulo counter at the master device is used to generate a reference signal (e.g., a sync pulse) each time the counter reaches a specific value, e.g., when the counter is reset. The sync pulse can then be used to control the PLL of the slave device so as to synchronize operations.

Of course, the components of the signal generation means can be implemented in dedicated hardware, or in software using an appropriate data processor, or using a combination of hardware and software. Depending on the costs and speeds required, the designer can choose the proper approach.

The term "device" as used in specifying the invention covers the circuitry as specified or the circuitry specified as component of a larger entity, e.g., the circuitry together with the entity (e.g., LED(s)) controlled by the control pulses.

BRIEF DESCRIPTION OF THE DRAWINGS

The invention is explained in further detail, by way of example and with reference to the accompanying drawings, wherein:

FIGS. 1, 2 and 3 are timing diagrams illustrating known ways to drive multiple LEDs;

FIGS. 9, 10 and 11 are timing diagrams illustrating the signals in the modulator of FIG. 8;

FIG. 18 gives formulae used in the discussion of the modulator of FIG. 16.

Throughout the Figures, similar or corresponding features are indicated by same reference numerals.

DETAILED DESCRIPTION OF THE EMBODIMENTS

Figure 5:
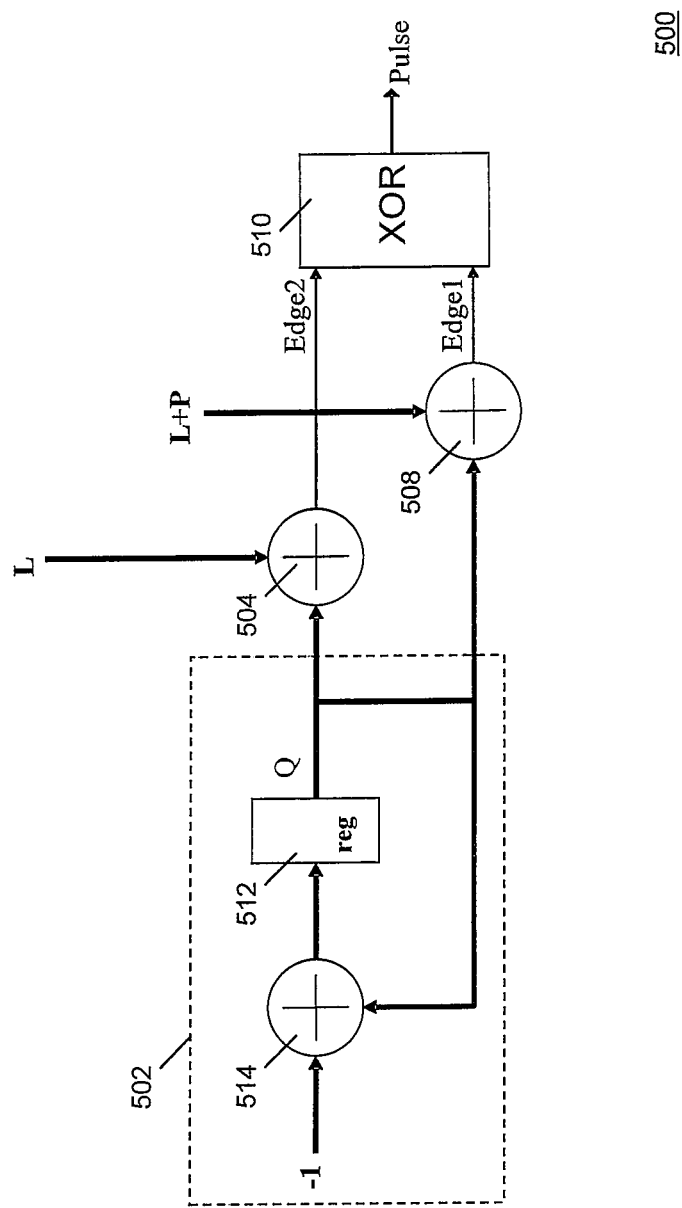
FIG. 5 is a block diagram of a first embodiment of a pulse modulator in the invention.

FIG. 5 is a block diagram of a first embodiment 500 of a rotating pulse width modulator in the invention. Modulator 500 comprises a down-counter 502, adders 504 and 508, and an XOR-gate 510. Down-counter 502 comprises a register 512 and an adder 514. Adder 514 has at its first input the quantity "minus unity" and at its second input the value stored in register 512. Register 512 has a width of N bits. Accordingly, counter 502 can be used to count down from $(2^N-1)$ down to zero. That is, counter value "Q" assumes the integer values inclusive of and between $(2^N-1)$ and zero in a recurrent order. The value of zero is used as reference value to define within a PWM period the position in time of the beginning (equivalent to the leading edge of the associated control pulse for turning on a specific LED) of the active time interval of the specific LED (equivalent to the length of the control pulse for the specific LED). Down-counter 502 supplies current counter value Q to adder 504 and to adder 508. Adder 504 adds a value L to counter value Q. The quantity L represents the time shift of the leading edge of the active time interval for the specific LED relative to the reference of Q equals zero. The reference can be considered the start of each PWM period in a sequence of PWM periods. Adder 508 receives a value (P+L). The quantity P represents the length of the active time interval for the specific LED or the width of the pulse for control of the specific LED per PWM period. Adder 508 adds the value (P+L) to the current counter value Q. Quantity L is N bits wide. That is, L assumes a value between and inclusive of zero and $(2^N-1)$. Quantity P can also be N bits wide. Adders 504 and 508 are each (N+1) bits wide or, in other words, adders 504 and 508 operate in modulo $(2^{N+1}-1)$. That is, the quantity (Q+L) can assume a value between and inclusive of zero and $(2^{N+1}-1)$; and the quantity (Q+P+L) can assume a value between and inclusive of zero and $(2^{N+1}-1)$. The most-significant bit (MSB) of the output of adder 504 and the MSB of the output of adder 508 are supplied to the inputs of an XOR-gate 510. XOR-gate 510 provides a logic low output if the input values are equal and a logic high if the input values are different.

Optionally, quantity P can be set to equal $2^N$ (and L equals zero as a result). This means then that the output of XOR-gate 510 is continuously high. This also implies then that the quantity P is one bit wider than Q and than L.

The logic value at the output of XOR-gate 510 defines then the pulse to control the relevant LED. This is explained with reference to FIG. 6 in the next example.

Figure 6:
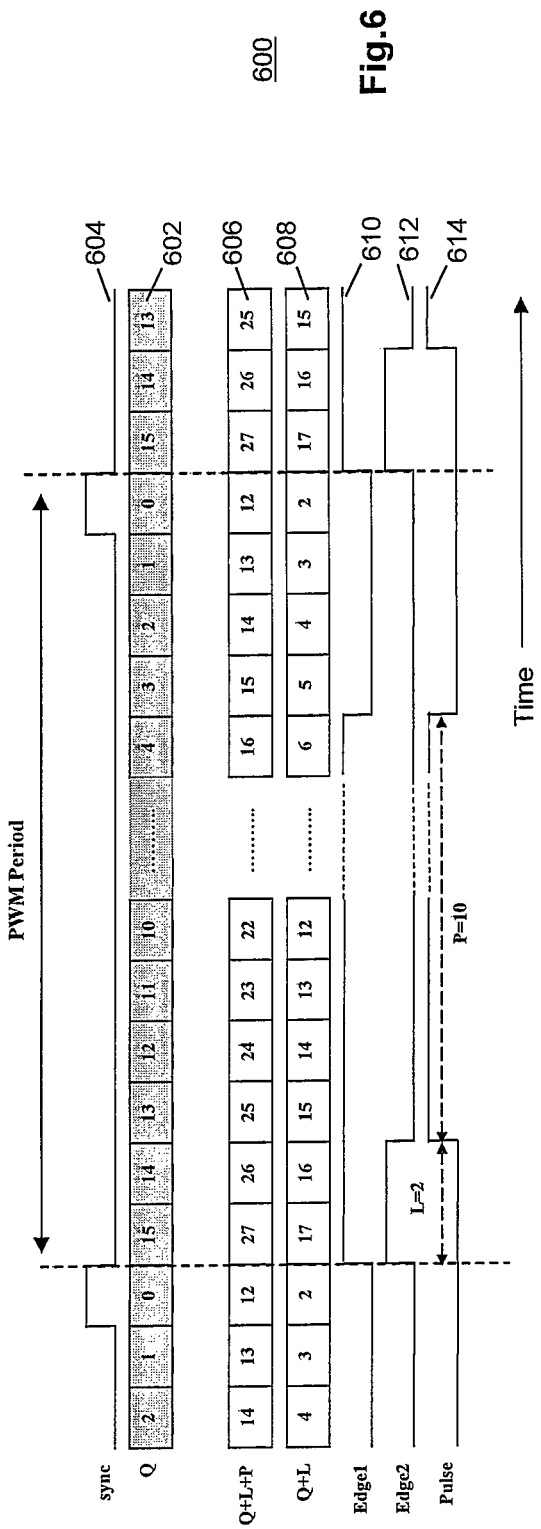
FIGS. 6 and 7 are timing diagrams illustrating the signals in the modulator of FIG. 5.

FIG. 6 is a diagram 600 illustrating the various values of the quantities Q, P and L and their combinations occurring during operational use of modulator 500 in a first example. It is assumed that counter 502 assumes a next value upon the next clock pulse from a clock generator (not shown). The unit of time diagram 600 equals one such clock pulse. The following values are assigned: N is set to the value 4, leading edge shift L is set to the value of 2 clock pulses and pulse width P is set to the value of 10 clock pulses. Reference numeral 602 indicates the values Q assumed by modulo down-counter 502 when time progresses. After counter 502 has assumed the value zero, the next value it assumes is $(2^N-1)=15$ in this example. A sync signal 604 is generated each time that Q assumes the value zero. The values assumed by quantities (Q+L+P) and (Q+L) are indicated by reference numeral 606 and 608, respectively. Their values are determined by the then current value of Q. The value of the MSB of the quantity (Q+L+P) is indicated by reference numeral 610. The MSB of the quantity (Q+L) is indicated by reference numeral 612. The resulting output signal of XOR-gate 510 is indicated by reference numeral 614 and signifies the pulse to control the on-time and off-time of the relevant LED. As is clear, the leading edge L of the pulse relative to the start of each PWM period equals 2 clock pulses, and its duration or pulse width P equals 10 clock pulses in this example.

Figure 7:
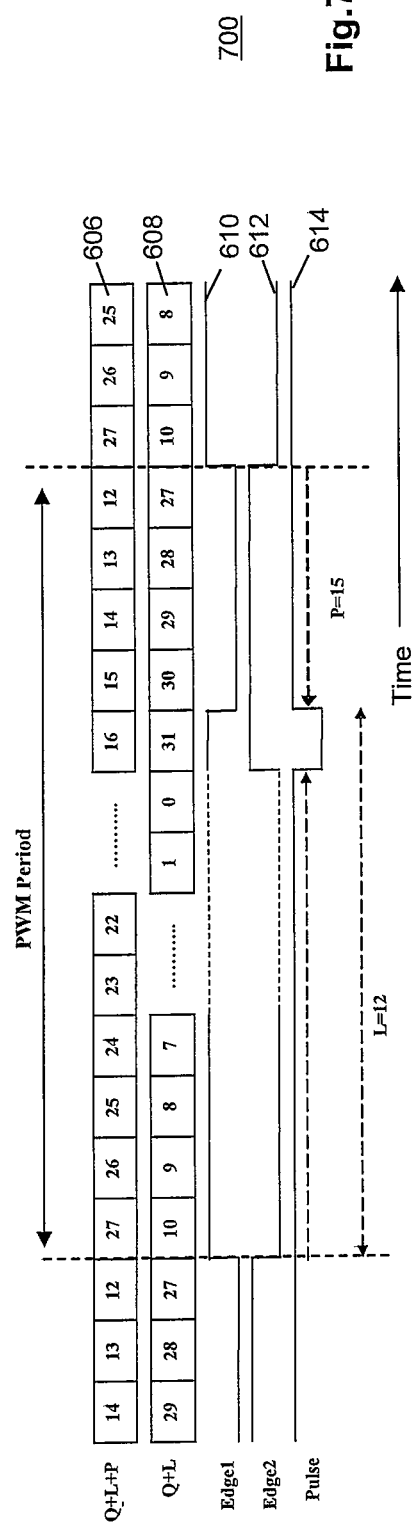

FIG. 7 is a diagram 700 illustrating the various values of the quantities Q, P and L and their combinations occurring during operational use of modulator 500 in a second example. The following values are assigned: N is set to the value 4, leading edge shift L is set to the value of 12 clock pulses and pulse width P is set to the value of 15 clock pulses. The values assumed by quantities (Q+L+P) and (Q+L) are indicated by reference numeral 606 and 608, respectively, as in diagram 600. The value of the MSB of the quantity (Q+L+P) is indicated by reference numeral 610, as in diagram 600. The MSB of the quantity (Q+L) is indicated by reference numeral 612 as in diagram 600. The resulting output signal of XOR-gate 510 is indicated by reference numeral 614 and signifies the pulse to control the on-time and off-time of the relevant LED. As is clear, the leading edge L of the pulse relative to the start of each PWM period equals 12 clock pulses, and its duration or pulse width P equals 15 clock pulses in this example. Note that pulse 614 now extends into the PWM period next to the PWM period wherein pulse 614 started. Note also that the scenarios of diagrams 600 and 700 are implemented using different parameter values for quantities L and P as input to the same modulator.

Figure 3:
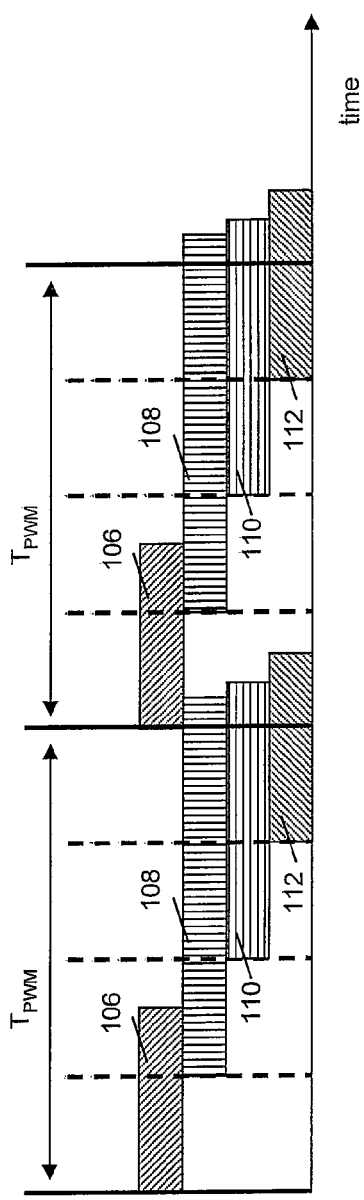
Figure 4:
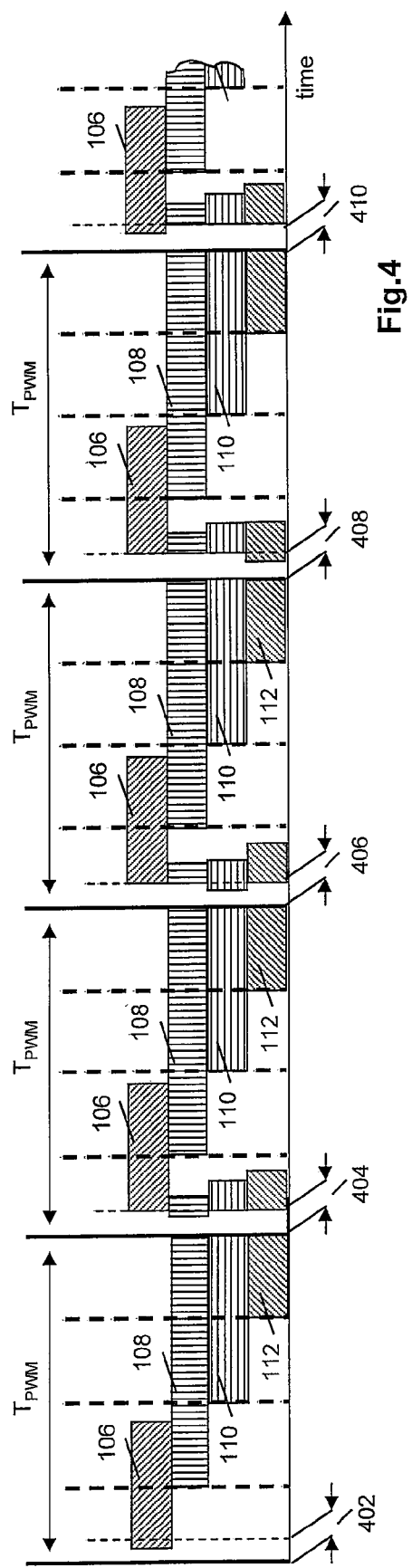
FIG. 4 is a timing diagram illustrating a desired way of driving multiple LEDs.
Figure 8:
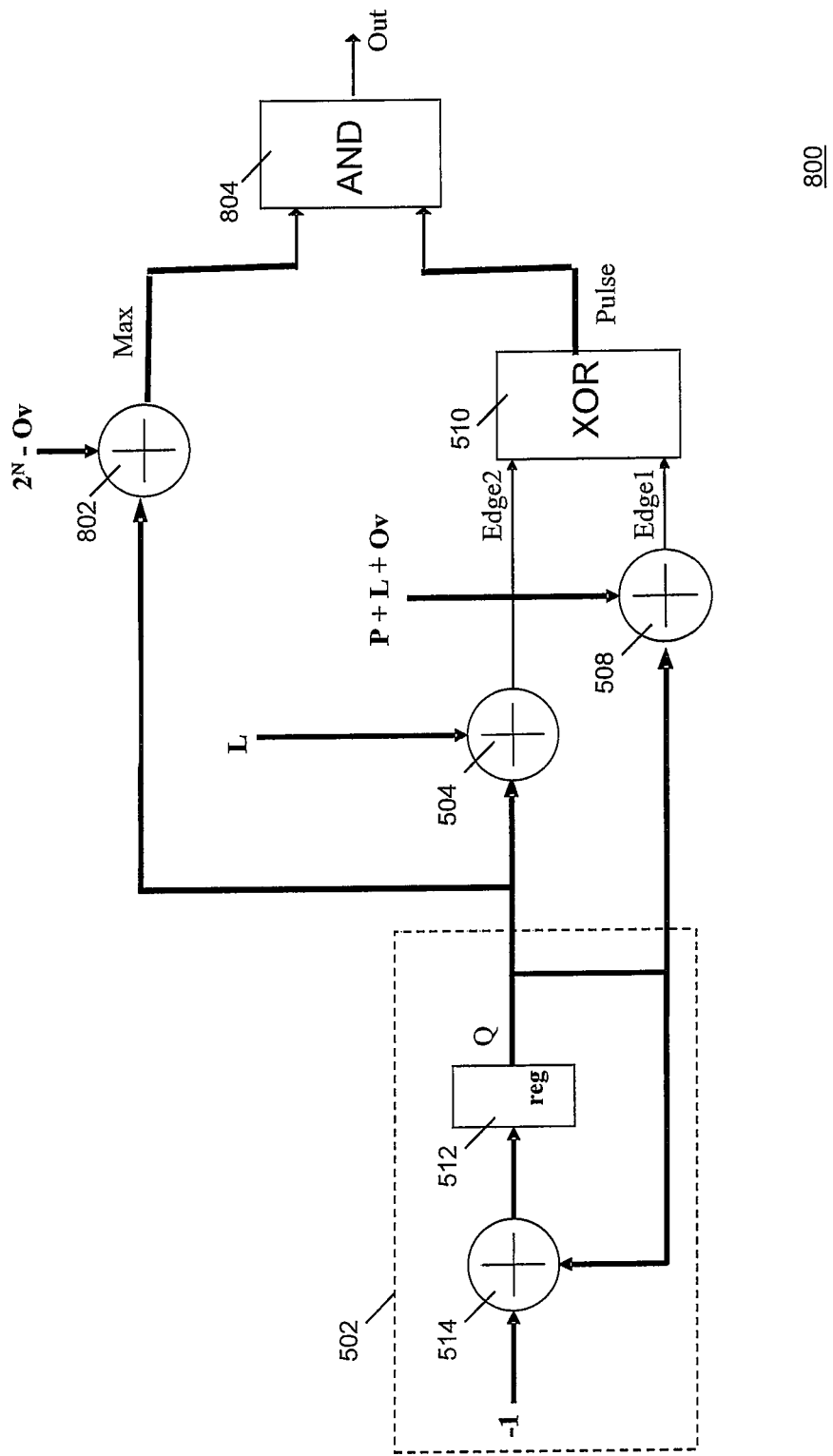
FIG. 8 is a block diagram of a second embodiment of a pulse modulator in the invention.

FIG. 8 gives a further embodiment 800 of a modulator in the invention. Now, modulator 800 supports the feature of limiting the pulse width P to a predetermined maximum, referred to as "DCmax". This enables to create a window to initiate a measuring step for color control, as mentioned under FIGS. 2 and 4 above with reference to reference numerals 202-206 and 402-410. The quantity DCmax equals $2^N$ minus a predetermined overflow, indicated by "Ov". So long as P+Ov is not larger than $2^N$, the pulse generated does not violate the specified conditions by setting the values of P and L. Modulator 800 is similar to modulator 500, but now comprises, in addition, an adder 802 and a logic AND-gate 804, and adder 508 receives as input the quantity (P+L+Ov) instead of (P+L). Adder 802 forms the sum of quantity Q and the quantity ($2^N$−Ov). Logic AND-gate 804 receives the output of adder 802 and the output of XOR-gate 510 and issues a signal "out".

FIGS. 9 and 10 are diagrams 900 and 1000 explaining the features of modulator 800 in the example, wherein quantity P is set to 10, quantity L is set to 2 (as in the example of diagram 600), and wherein quantity DCmax is set to 11. Accordingly, quantity Ov equals 5. The values assumed by quantity [Q+($2^N$−Ov)] are indicated by reference numeral 902, and the values assumed by the output of adder 802, labeled "max", are indicated by reference numeral 904. In diagram 1000, the following is indicated. Reference numeral 602 indicates the values assumed by quantity (Q+L+P+Ov) at the output of adder 508. Reference numeral 608 indicates the values assumed by quantity (Q+L) at the output of adder 504. Reference numerals 610 and 612 indicate the values assumed by the MSB of quantity (Q+P+L+Ov) and the MSB of quantity (Q+L), respectively. Reference numeral 614 indicates the pulse at the output of XOR-gate 510. Reference numeral 1002 indicates the pulse "out" at the output of AND-gate 804 that eventually controls the on-times and off times of the LED.

Accordingly, quantity "DCmax" having value 11 masks a part 1004 of pulse 614, from Q=4 to Q=0 inclusive. This would imply that pulse width P had a value P=11. However, P was set to the value P=10. This would imply that there are only nine clock cycles left for P when L is forced to be L=2. Here, an advantage of rotating pulse-width modulator 800 becomes apparent, as modulator 800 now adds masked part 1004 of pulse 614 to the end of pulse 614 in the output of AND-gate 804. The output of AND-gate 804 is truncated and part 1004 is moved to the beginning of the next PWM period, i.e., the same period because of the rotating feature implemented by modulator 800. Note that the leading edge shift L has still the value L=2, and that the sum of the pulses at the output of AND-gate 804 is still P=10.

Figure 11:
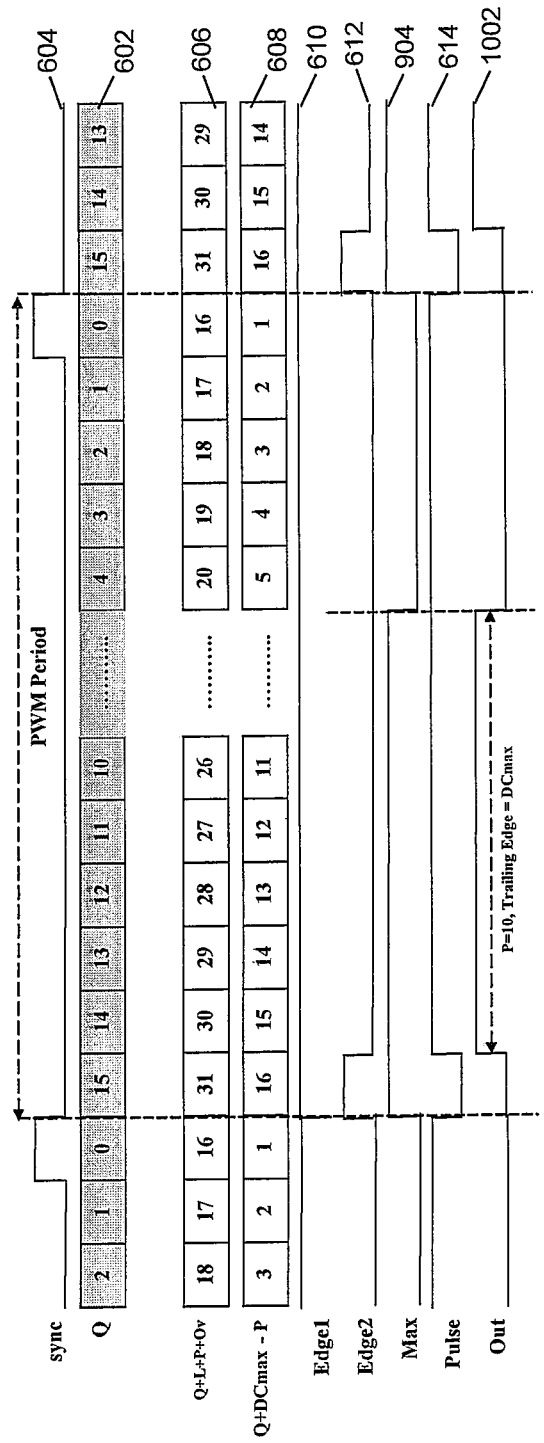

Some applications may require that the trailing edge of a pulse be set to the DCmax-level, and that the pulse-width be modulated by moving the leading edge of the pulse. This can easily be implemented with modulator 800 by setting the value of leading edge shift L to L=(DCmax−P). FIG. 11 illustrates this scenario in a diagram 1100, wherein quantity P is set to P=10; quantity DCmax is set to DCmax=11; and leading edge shift L is set to L=(DCmax.−P)=1. Reference numeral 606 indicates the values assumed by the quantity (Q+L+P+Ov) at the output of adder 508. Reference numeral 608 indicates the values assumed by the quantity (Q+DCmax−P) at the output of adder 504. Reference numeral 610 indicates the values assumed by the MSB at the output of adder 508 (logic high all the time in this example). Reference numeral 612 indicates the values assumed by the MSB at the output of adder 504. Reference numeral 904 indicates the values assumed by the MSB at the output of adder 802. Reference numeral 614 indicates the values assumed by the output of XOR-gate 510. Reference numeral 1002 indicates the values at the output of AND-gate 804.

As mentioned above, the DCmax parameter enables to create a window to initiate a measurement control pulse. The measurement control pulse should be created in such as way, that the total width of the portions of the same output pulse still equals P per PWM period. The measurement control pulse is created under control of the sign bit of the result of the addition of the measurement pulse width M to the value of the inverted Q (1−complement). Using the inverted Q (indicated as "Qinv"), the measurement pulse is created at the end of the period. The output is then created by a logic OR-function. The total pulse width P is corrected by subtracting the measurement width M from the value P. This results in a shift of the trailing edge of the signal "pulse" (at the output of XOR gate 510) to the left in the diagrams showing the evolution of the values of the various quantities over time. It is also possible to correct the signal "pulse" at the leading edge when keeping the trailing edge equal to DCmax. The parameter L should then be replaced by (DCmax−P+M). From another perspective: if quantities L, P and M are specified, then the magnitude of M is relative to the end of P because L specifies the trailing edge. If L is specified dependent on DCmax, then the trailing edge is fixed by increasing the leading edge shift by M. In this way, the size of M is taken from the trailing edge.

Further, note that the measurement pulse overlaps sync signal 604, i.e., sync pulse 604 occurs within the time slot created by the measurement pulse.

Figure 12:
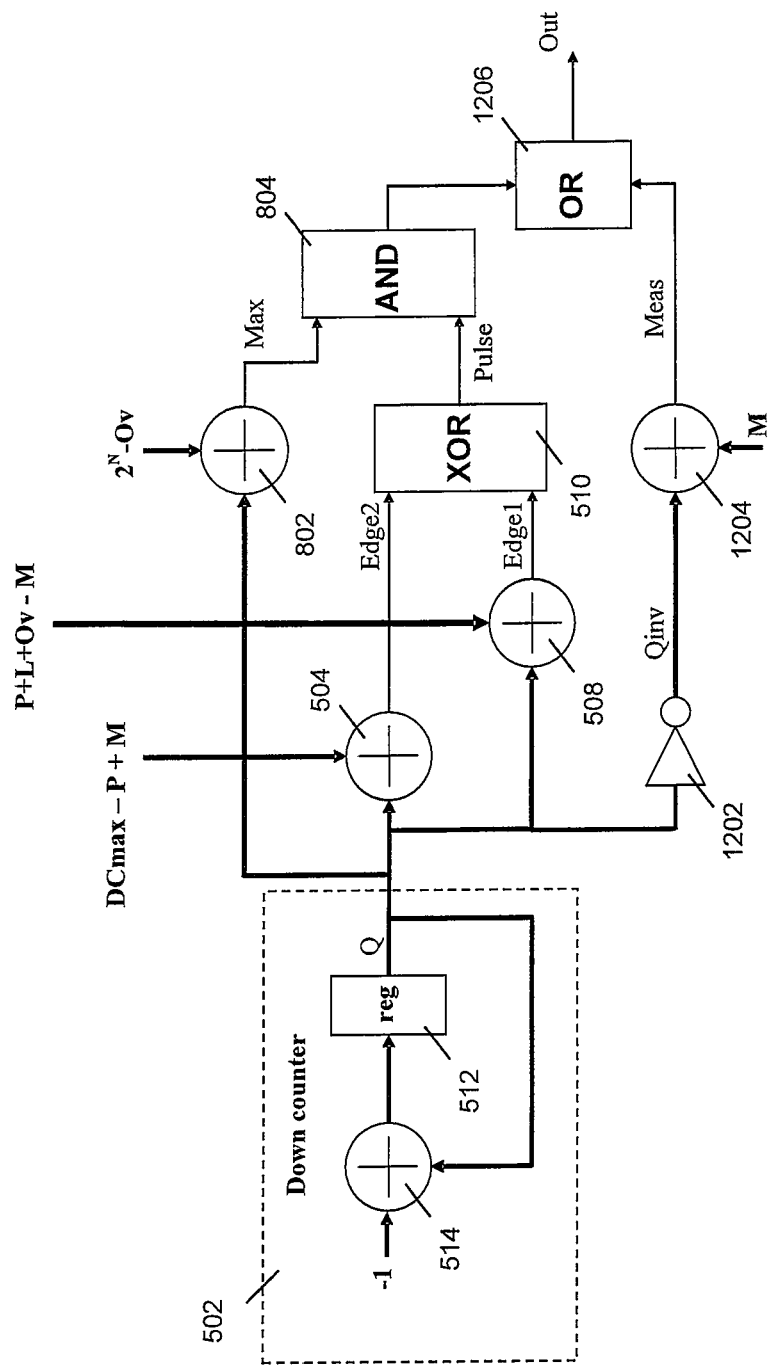
FIG. 12 is a block diagram of a third embodiment of a pulse modulator in the invention.

FIG. 12 is a block diagram of an embodiment 1200 of the modulator in the invention illustrating above scenario. Modulator 1200 comprises an inverter 1202 that takes the logic complement of the current value of counter output Q. In effect, the output of inverter 1202 behaves as if it were supplied by an up-counter of similar configuration as down-counter 502, but now with a quantity "+1" being added by adder 514 (instead of "−1") to current counter output Q each clock pulse. Modulator 1200 further comprises an adder 1204 that adds the value of the measurement pulse-width M to the inverted value Qinv supplied by inverter 1202. The MSB of the quantity (Qinv+M) is then supplied to logic OR-gate 1206 that also receives the output from AND-gate 804.

Figure 13:
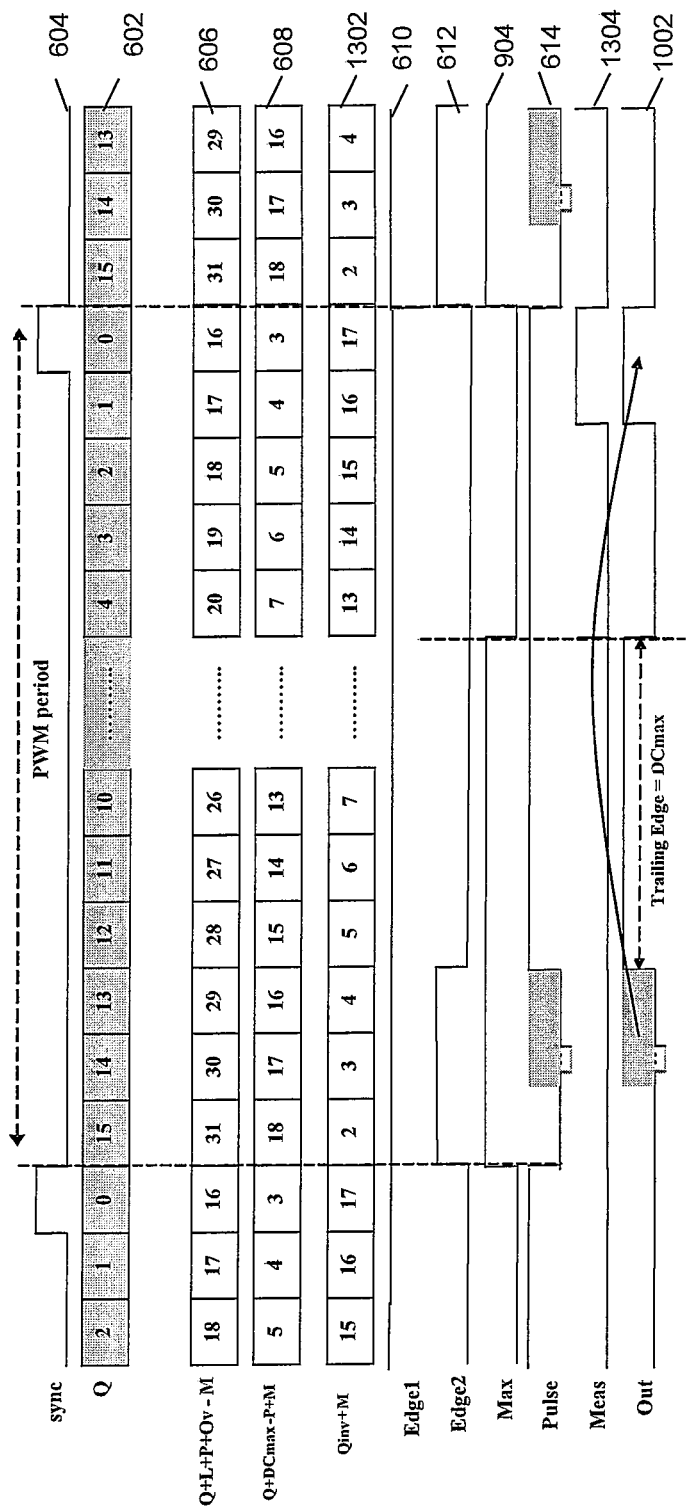
FIG. 13 is a timing diagram illustrating the signals in the modulator of FIG. 12.

FIG. 13 is a diagram illustrating the values of the relevant signals within modulator 1200 for the example wherein P is set to P=10, DCmax is set to DCmax=11, M is set to M=2, and L is set to L=DCmax−P+M=3. Overflow Ov is then ($2^N$−DCmax)=16−11=5. Reference numeral 606 indicates the values assumed by quantity (Q+L+P+Ov−M) at the output of adder 508, whose MSB is supplied to XOR-gate 510. Quantity (Q+L+P+Ov−M) can also be written as (Q+DCmax+Ov) taking the expression for quantity L into account. Reference numeral 608 indicates the values assumed by quantity (Q+DCmax−P+M) at the output of adder 504, whose MSB is supplied to XOR-gate 510. Reference numeral 1302 indicates the values assumed by quantity (Qinv+M), whose MSB is supplied by adder 1204 to logic AND-gate 1206. Reference numeral 1304 indicates the MSB value at the output of adder 1204 and supplied to OR-gate gate 1206. OR-gate 1206 supplies the control signal for controlling the on times and off times of the relevant LED. As is clear, the width of the measurement pulse is borrowed from the leading edge of signal "pulse" at the output of XOR-gate 510.

A further extension that can be added to the modulator in the invention, relates to a power-saving mode (PSM) in operational use of the modulator. In PSM, the power supply that provides power to the LED is modulated as well, in the sense that the power supply is switched on when the LED is turned on, and else the power-supply is switched off. This modulation contributes to the power saving of the electronic circuit as a whole that includes the LEDs as well as the LEDs' control circuitry. The PSM of the power supply could be controlled by signal "out", i.e., by the same signal that also controls the on-time and off-time of the LED per PWM period. However, the power supply needs, in practice, a certain time to be set up after being switched on. Similarly, when switched off, the power supply needs a certain time to die down. These properties require a switching characteristic that is a compromise between power saving and controlling the on/off duty cycle of the power supply. One way of implementing this is to control the power supply using the "pulse" signal at the output of XOR-gate 510 and to modify this signal so as to precede the turning on of the LED by a time period of B clock pulses. That is, the power supply is turned on B clock pulses before the LED is turned on. The signal "power on" is active during that part of the PWM period, during which the LED is most likely to be switched on.

This power saving feature is attractive if the intensity of the LED is relatively low, i.e., if quantity P is small compared to the length of the PWM period.

Figure 14:
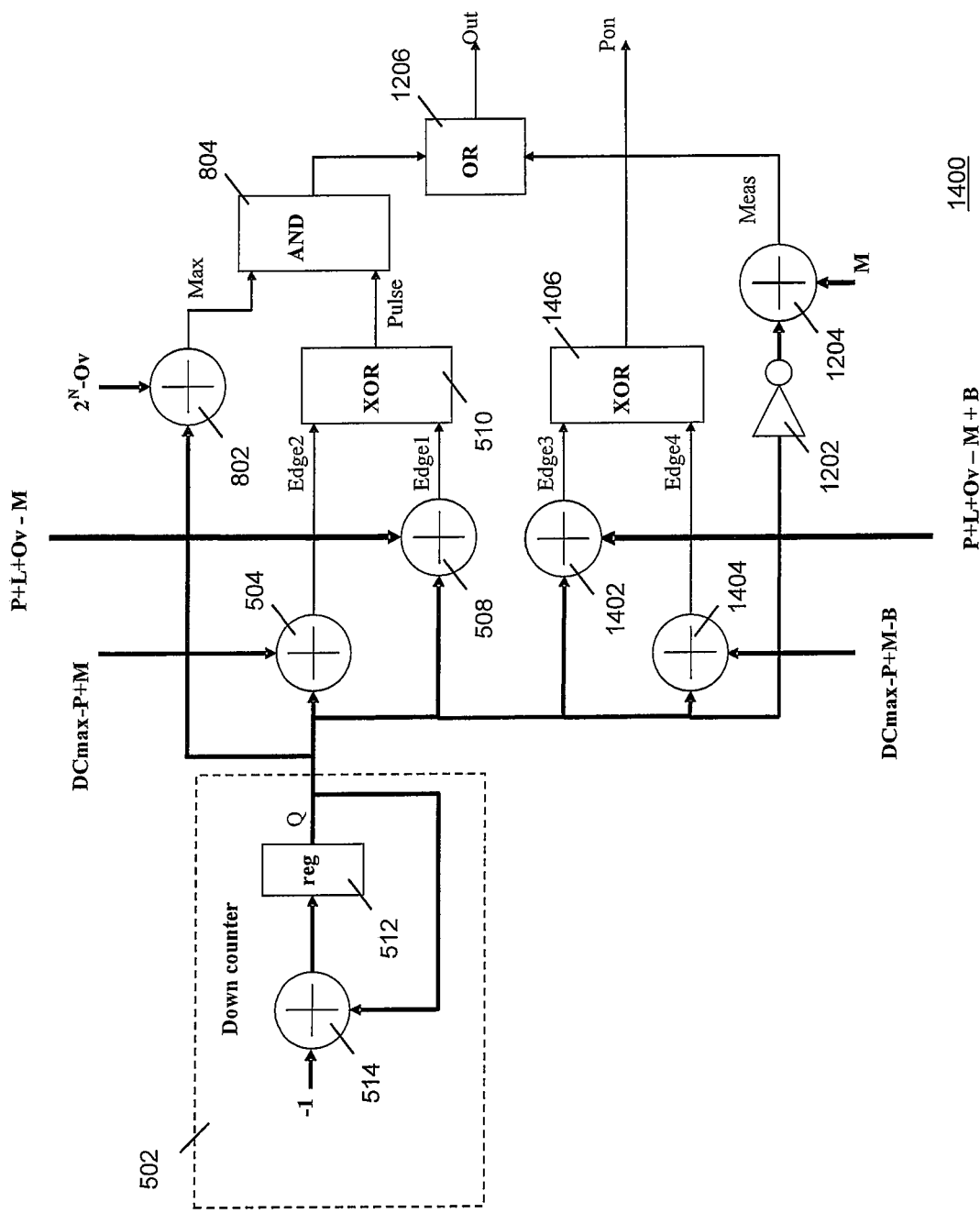
FIG. 14 is a block diagram of a fourth embodiment of a pulse modulator in the invention.

FIG. 14 is a block diagram of a modulator 1400 in the invention implementing this PSM feature. Modulator 1400 comprises an adder 1402, an adder 1404 and a further XOR gate 1406. Adder 1402 forms the quantity (Q+DCmax−P+M−B). Adder 1404 forms the quantity (Q+P+L+Ov−M+B). The MSB of each of these quantities is supplied to XOR-gate 1406 that supplies at its output the control signal "Pon" for the power supply.

Figure 15:
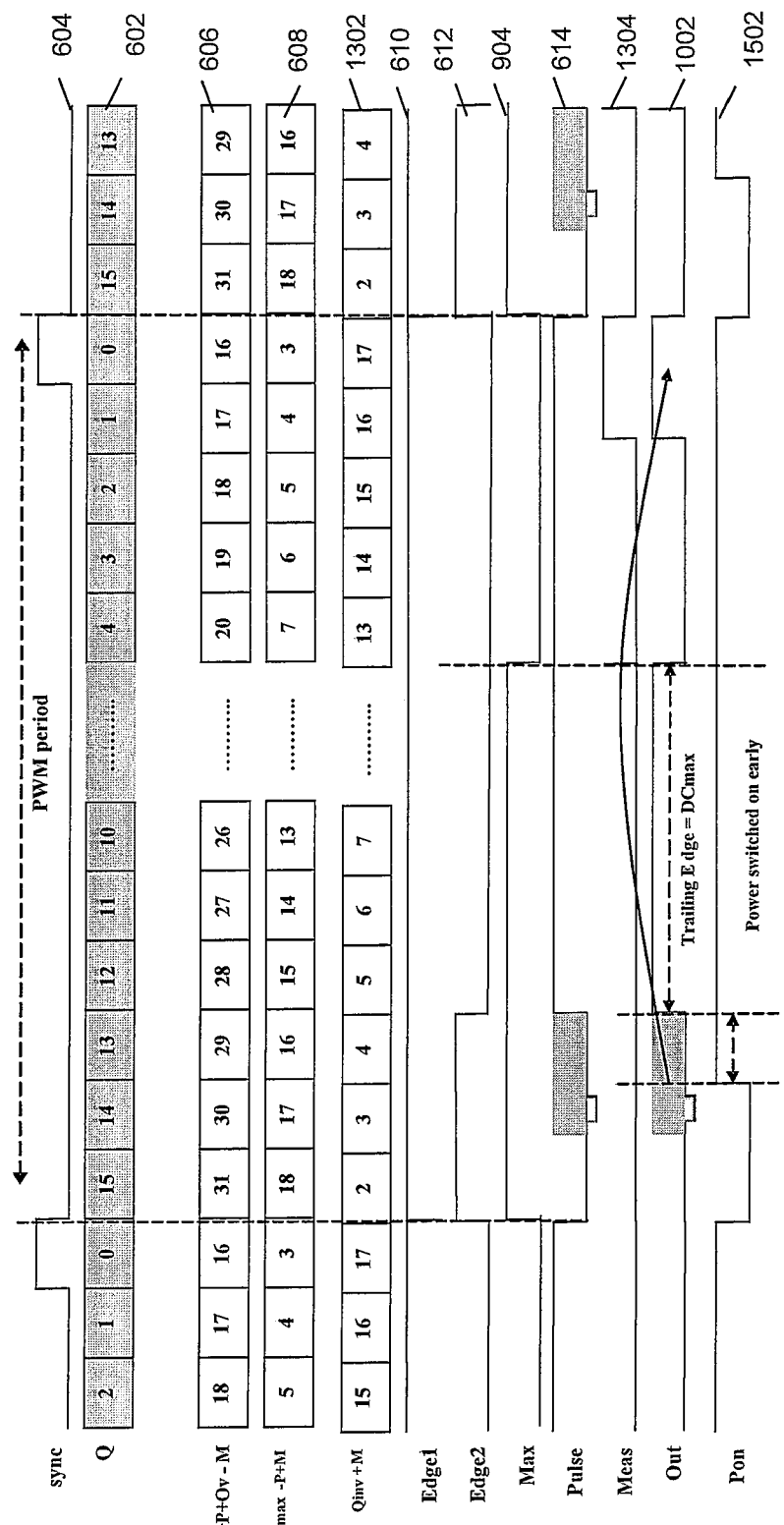
FIG. 15 is a timing diagram illustrating the signals in the modulator of FIG. 14.

FIG. 15 is a diagram 1500 illustrating the generation of the relevant quantities in modulator 1400. Note that a sub-set of the quantities assume the same values as in diagram 1300, as adders 1402 and 1404 and XOR-gate 1406 operate in parallel with the components of modulator 1200. Diagram 1500 illustrates the power-saving feature with the measurement-pulse on and the trailing edge of the pulse set to DCmax. The values assumed by signal "Pon" is indicated by reference numeral 1502. Signal "Pon" is generated such that it switches on and off only once per PWM period. This is a good compromise between power-saving and on-time of the power supply. Because the trailing edge of signal "pulse" occurs at DCmax, it may be assumed that the duration of the time period between the trailing edge of "pulse" and the leading edge of the measurement pulse is small. If the trailing edge of signal "pulse" is not set at DCmax, and if the LED is not to operate at low intensity, then the approach illustrated in FIGS. 14 and 15 is less efficient in case the leading edge shift of the pulse is set to a value small with respect to the PWM period length or is even taken zero.

Figure 16:
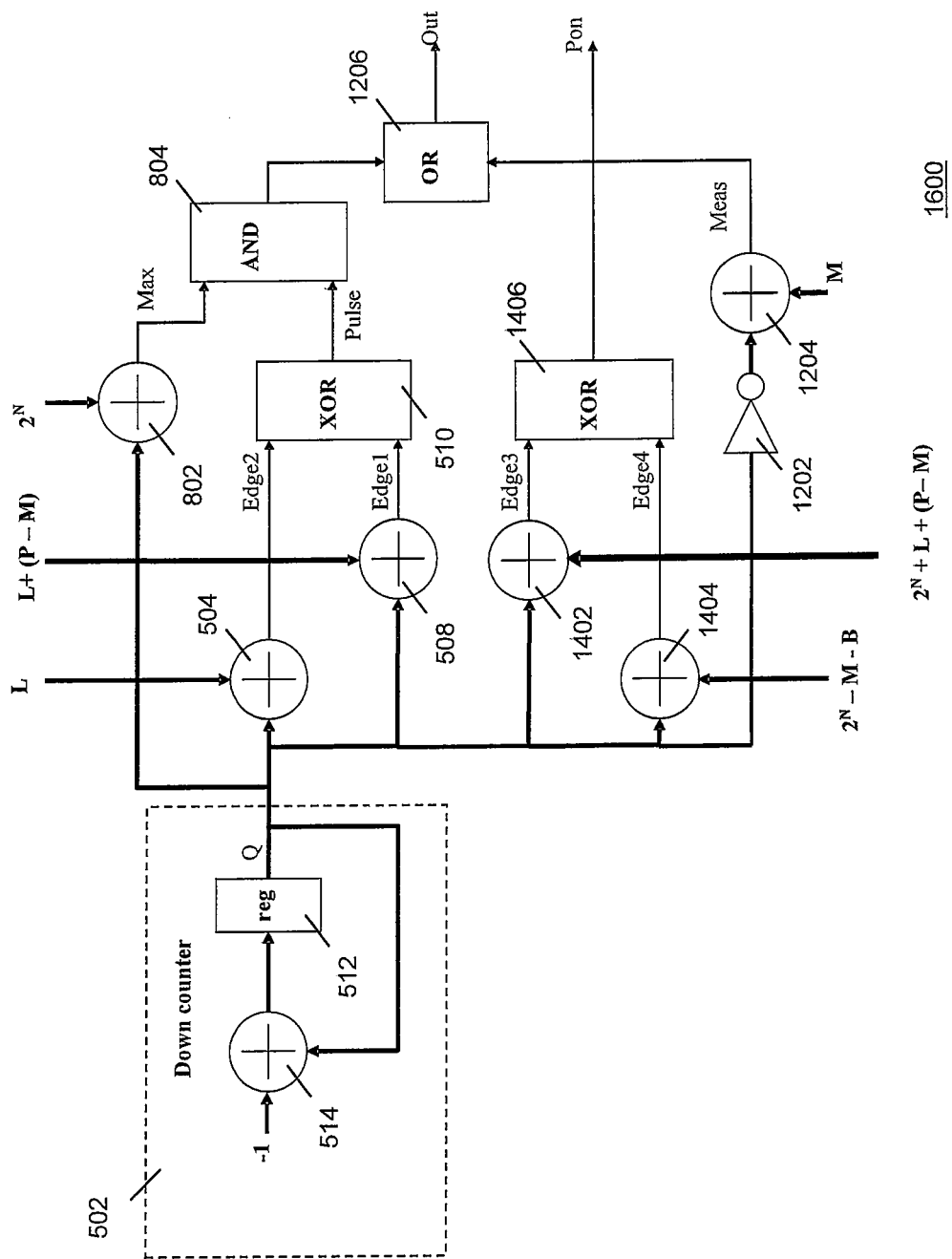
FIG. 16 is a block diagram of a fifth embodiment of a pulse modulator in the invention.

FIG. 16 gives a further embodiment 1600 of a modulator in the invention illustrating another approach in order to implement an efficient PSM if the leading edge shift L of the LED's control pulse is small. Modulator 1600 uses the same circuitry as modulator 1400, discussed above. However, the input parameters are defined such that the power supply is switched on early before the measurement pulse and remains on till the trailing edge of signal "pulse".

Figure 17:
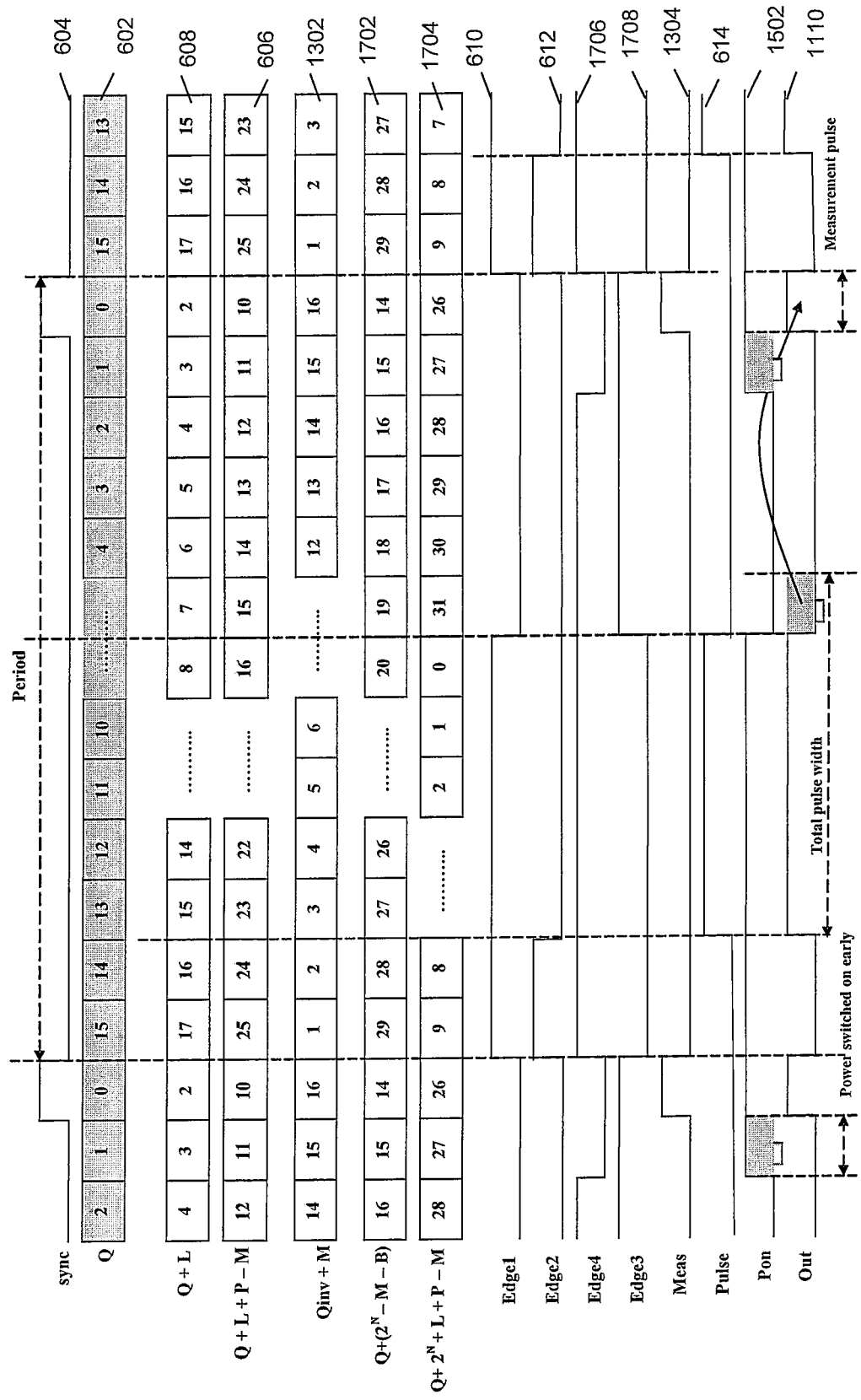
FIG. 17 is a timing diagram illustrating the signals in the modulator of FIG. 16.

FIG. 17 is a diagram 1700 illustrating the values of various signals in modulator 1600, having a PSM, a measurement window and leading edge control. In the example illustrated, P is set to P=9, M is set to M=1, L is set to L=2, B is set to B=1, and DCmax is set to DCmax=16 ("no maximum"). In order to calculate the power pulse "Pon", the leading edge shift for signal "Pon" and the width of "Pon" can be determined by setting the leading edge of "Pon" to B clock pulses before the occurrence of the measurement pulse of width M, and the pulse width of "Pon" to the sum of M, B, L and (P−M), see the formulae of FIG. 18. In diagram 1700, reference numerals 1702 and 1704 indicate the values assumed by the output signal of adder 1404 and the output signal of adder 1402, respectively. Reference numerals 1706 and 1708 indicate the value of the MSB at the output of adder 1404, and the value of the MSB at the output of adder 1402, respectively.

Above embodiments are shown using a down-counter. A similar approach can be made using an up-counter, taking care of the proper signs and logic operations.

Embodiment 500 of the invention illustrates duty cycle control of the control pulse on the basis of pre-specifying the combination of the magnitude the leading edge shift L and the magnitude of the pulse width P. Embodiment 800 illustrates duty cycle control by means of pre-specifying the combination of the magnitude the leading edge shift L, the magnitude of the pulse width P, and the maximum pulse width through the magnitude of overflow Ov. Embodiment 1200 illustrates duty cycle control by means of pre-specifying the combination of the magnitude the leading edge shift L, the magnitude of the pulse width P, the maximum pulse width through the magnitude of overflow Ov, and the magnitude of the measurement time window M. Embodiment 1400 illustrates duty cycle control by means of pre-specifying the combination of the magnitude the leading edge shift L, the magnitude of the pulse width P, the maximum pulse width DCmax, the magnitude of the measurement time window M, and control of the power supply through pre-specifying the magnitude of B. As is clear, other combinations of the quantities mentioned can be used for control of the pulse generation in the invention. For example, the power supply control features of embodiment 1400 can be used as an option with the other embodiments as well. As another example, the control pulse can be controlled at the leading edge by keeping the trailing edge equal to DCmax, and replacing the quantity L by the quantity (DCmax−P) in above embodiments.

Above embodiments of the invention have been illustrated within the context of driving LEDs. As mentioned earlier, PWM is a known technique for control of the duty cycle of a signal, power source or other device. The invention enables a simple approach to programming the PWM scheme. Instead of driving LEDs, the invention could as well be applied to, e.g., control of an electric motor such as a three-phase motor. Using PWM, the duty cycle of such motor can be controlled and, as a result thereof, its power. The shift of the leading edge is determined by the number of phases (here: three) in the motor. The PWM control channels (i.e., the control pulses per PWM period) each have their own leading edge shift set individually. Another application of the invention resides in, e.g., control of the fuel injection of a multi-cylinder internal combustion engine. Each cylinder is to receive an amount of fuel periodically, depending on the phase of its piston relative to the phase(s) of the other piston(s). The invention enables to generate control pulses for control of the injection process per cylinder, whose width P and leading edge L may vary from one revolution of the engine's crankshaft to the next revolution by simply setting the relevant parameter values of these quantities under control of a measurement and feedback mechanism. Again, the pulses per period of revolution can be generated using a single counter so as to accurately position the pulses for the various cylinders relative to one another. The counter itself may be controlled by the actual angular speed of the crankshaft so as to have a fixed number of count values per revolution.

The counters, logic gates, adders and inverters in modulators 500, 800, 1200, 1400 and 1600 could be implemented in hardware or in software or in a combination thereof, depending on, e.g., the speed required and the cost. Modulators 500, 800, 1200, 1400 and 1600 could be supplied as stand-alone devices or could be supplied as functionally integrated with a microcontroller.

The invention claimed is:

1. An electronic device with circuitry for generating a control pulse using pulse-width modulation during each specific one of a plurality of periods in a sequence of the periods, the circuitry comprising:
 a modulo counter, whose count value is reset to a predetermined value after the specific period has elapsed; and
 signal generation means connected to the counter and comprising:
  a first combiner for supplying at the first combiner output the count value combined with an edge quantity indicative of a shift of an edge of the control pulse relative to a beginning of the current period;
  a second combiner for supplying at the second combiner output the count value combined with a width quantity indicative of a width of the control pulse; and
 a first logic gate receiving first and second bit values, respectively, indicative of a first most-significant bit at the first combiner output and of a second most-significant bit at the second combiner output, and supplying at a first gate output a first logic output signal representative of the control pulse; and
 wherein the signal generation means further comprises:
  a third combiner for supplying at a third combiner output the most-significant bit of the count value combined with an overflow quantity indicative of an upper boundary of the width; and
  a second logic gate connected to the third combiner output and to the first gate output for providing at a second gate output a second logic output signal representative of the control pulse.

2. The device of claim 1, wherein the signal generation means further comprises:
 an inverter connected to the modulo counter for inverting the count value;
 a fourth combiner for supplying at a fourth combiner output the inverted count value combined with a second width quantity indicative of a second width of a time interval during the specific period;
 a third logic gate connected to the second gate output for receipt of the second logic output signal and to the fourth combiner output for receipt of the most-significant bit of the inverted count value combined with the second measurement width quantity, and having a third gate output for supply of a third logic output signal representative of the control pulse.

3. The circuit of claim 2, wherein the signal generation means further comprises power control circuitry for generating a power control signal for control of a power supply to a physical entity controlled by the control pulse, the power control circuitry comprising:
 first means for supplying a first intermediate signal, generated by modifying the count value combined with the edge quantity by a lead quantity indicative of a time for switching on the power supply prior to switching on with the control pulse;
 second means for supplying a second intermediate signal, generated by modifying the count value combined with the width quantity by the lead quantity and for supplying a second power control signal;
 third means for generating the power control signal based on subjecting the most-significant bit of the first intermediate signal and the most-significant bit of the second intermediate signal to a logic operation.

* * * * *